United States Patent [19]
Lawson et al.
[11] 3,890,148
[45] June 17, 1975

[54] EXPOSURE OF LIGHT-SENSITIVE MATERIALS

[75] Inventors: Leslie Edward Lawson; Peter John Smith, both of Orpinion, England

[73] Assignee: Howson-Algraphy Limited, Kent, England

[22] Filed: Feb. 15, 1973

[21] Appl. No.: 332,592

Related U.S. Application Data

[63] Continuation-in-part of Ser. No. 167,825, July 30, 1971, abandoned.

[52] U.S. Cl. .............................. 96/33; 96/41; 96/44
[51] Int. Cl.² .............................. G03F 7/02
[58] Field of Search .............................. 96/44, 33, 41

[56] References Cited

UNITED STATES PATENTS

| | | | |
|---|---|---|---|
| 2,315,101 | 3/1943 | Zukmann | 96/44 |
| 2,687,949 | 8/1954 | Marx | 96/44 |
| 2,711,031 | 6/1955 | Kessler | 96/41 |
| 2,972,533 | 2/1961 | Frankau et al. | 96/41 |
| 2,999,016 | 9/1961 | Beeber et al. | 96/75 |

FOREIGN PATENTS OR APPLICATIONS

| | | | |
|---|---|---|---|
| 602,981 | 8/1960 | Canada | 96/33 |

*Primary Examiner*—David Klein
*Attorney, Agent, or Firm*—Nichol M. Sandoe

[57] ABSTRACT

In a method of exposing light sensitive materials, particularly positive working presensitised lithographic printing plates, an additional exposure is given either before, or after, the image-wise exposure. The additional exposure is given using a mask provided with a light-transmitting pattern conforming to those areas of the light sensitive material which are not struck by light during the image-wise exposure but which are desired to be struck by light. The mask comprises a light transmitting sheet coated with a non-light transmitting composition and the light-transmitting pattern is produced by treating parts of the coating with a liquid.

8 Claims, No Drawings

EXPOSURE OF LIGHT-SENSITIVE MATERIALS

This application is a continuation-in-part of our co-pending application Ser. No. 167,825, filed July 30, 1971, now abandoned.

This invention relates to the exposure to light of photo-sensitive materials.

Presensitised positive-working surface lithographic plates are well known and comprise a support coated with a layer of photo-sensitive material. On image-wise exposure of such presensitised plates to actinic light, the light-struck areas of the photo-sensitive material on the plate become soluble in liquids which do not dissolve the non-light-struck photo-sensitive material. Thus, by developing the image-wise exposed plate with such a liquid, an image constituted by the non-light-struck areas of the photo-sensitive material is left on the support. Although such presensitised positive-working lithographic plates have numerous advantages over the more traditional reversal deep-etch system of producing printing plates from positives, they do suffer from the severe disadvantage that the edges of each individual positive film cast shadows and hence parts of the photo-sensitive material which are desired to be struck by light during the exposure are frequently not in fact struck by sufficient light. Thus, the edges of each individual positive film are often recorded as fine lines on the plate during image-wise exposure. After processing therefore, these unwanted fine lines have to be removed from the plate before the plate can be used to print the required commercial design. This removal has hitherto been carried out by mechanical abrasion and/or by manually applying a suitable deletion fluid (sometimes referred to as a stop-out or staging solution) to the developed plate. The use of such a fluid, particularly when the number of film edges is large, can seriously reduce the quality of the final printing plate since, in practice, it is difficult to ensure that the fluid does not contact the actual image areas in addition to the fine lines which it is desired to remove. Moreover, it is desirable for the image in a direct positive plate to be resistant to solvents and acids and consequently it is difficult to compound a fluid with which to carry out any necessary deletions on such a plate. For example, the photo-sensitive material might be a photo-degradable polymer which is completely insoluble in solvents before exposure. In an alternative procedure for removing the unwanted fine lines there may be used a mechanically prepared drop-out mask. Such masks are positioned adjacent the photo-sensitive layer in such a manner as to enable a second exposure to light to act locally on the unwanted lines so that they may be removed during the normal developing operation. These masks generally consist of a sheet of thin stable translucent film on which have been located suitable areas which are opaque to the actinic light being employed. These areas are located so that they prevent light from striking those parts of the photo-sensitive material which were not and were not intended to be struck by light during the primary image-forming exposure and generally consist of, for example, black paper and/or red adhesive tape adhered to the film. Alternatively, they may consist of a similar film suitably covered with a strongly coherent coloured layer which after being mechanically cut in an appropriate manner is peeled away to leave the opaque areas. The production of such mechanically prepared masks is both tedious and time consuming.

In another attempt to reduce the occurrence of the shadows to a minimum, it has been proposed to make use of diffusing layers or screens, or more or less diffuse sources of light. Further, special equipment has also been produced to introduce a suitable degree of diffusion during the image-forming exposure. However, such approaches invariably cause a slight but significant loss of fine lines or dots on the eventual printing plate and hence in the resulting copies.

According to one aspect of the present invention there is provided a method of exposing a layer of photo-sensitive material to an image so that actinic light strikes areas of the layer which are desired to be struck by actinic light but which are not sufficiently struck by actinic light during the image-forming exposure, which method comprises providing a sheet of actinic light transmitting material coated with a composition which is opaque to actinic light and which comprises an actinic light absorbing dye and preferably a binder, forming a mask by treating those parts of the composition which correspond to said areas with a liquid to render said parts actinic light transmitting and form on the sheet an actinic light transmitting pattern conforming to said areas, and exposing the layer to actinic light through said mask either before or after subjecting the layer to the image-forming exposure.

According to another aspect of the present invention there is provided a mask for use in a method of exposing a layer of photo-sensitive material to an image so that actinic light strikes areas of the layer which are desired to be struck by actinic light but which are not sufficiently struck by actinic light during the image-wise exposure, which mask comprises a sheet of actinic light transmitting material coated with a composition which is opaque to actinic light and which comprises a binder and an actinic light absorbing dye, parts of the composition having been treated with a liquid to render said parts actinic light transmitting so that the sheet is provided with an actinic light transmitting pattern conforming to said areas.

In accordance with the present invention the plate is subjected to an additional exposure whilst using a readily preparable mask to protect those areas of the photo-sensitive material which have been, or which will be, correctly non-light-struck during the image-forming exposure. The additional exposure is given to cause light to strike substantially only those areas of the photo-sensitive material which have not been, or which will not be, struck by light during the image-forming exposure but which are in fact desired to be light-struck. In accordance with the present invention the mask is prepared in a very simple manner indeed since, in essence, it is merely necessary to "paint" the desired pattern on the coated sheet using the treating liquid. This can be effected much more rapidly and easily than the hitherto known methods of making masks as described above. The mask can be prepared essentially by chemical means and by suitable choice of chemicals, the invention can be practised in many ways and can prove to be economically sound.

The present invention is particularly useful when it is desired to expose positive-working lithographic plates, e.g. those including a quinone diazide as light sensitive material, to positive images carried on translucent film. Ordinarily, the film edges would cast shadows on the photo-sensitive material of the lithographic plate during exposure with the result that areas of the photo-sensitive material would not be light-struck as desired and consequently, on development, the plate would include a plurality of fine lines corresponding to these edges. However, by subjecting the lithographic plate to an additional exposure through the mask in accordance with the present invention, these lines are struck by light and hence to not remain after development. It will be apparent, moreover, that the method of the present invention can be used to ensure the removal of any unwanted areas from the photo-sensitive material whether these areas are caused by inherent limitations of the system being used or not. For example, the method of the present invention can be used to prevent selected artistic or literary matter present on the positive from being recorded on the printing plate.

The colour and optical density of the materials used to produce the mask depend upon the nature of the light used in the image-wise exposure. Thus, the sheet is such that it transmits that light whereas the coating on the sheet does not. The sheet may be formed of any suitable translucent film material and the coating on the sheet may be any suitable dye-containing composition which absorbs light at those wavelengths to which the photo-sensitive material is sensitive and which can be treated with a liquid so that the coated sheet becomes light-transmitting in the treated parts. Morever, in order to facilitate removing parts of the non-light-transmitting material from the sheet, it is preferred for the coated sheet to be sufficiently translucent so that the edges of the positive film, and any matter in the image which is not to be recorded, can be seen through the coating of non-light transmitting composition.

In one method of carrying out the present invention, the liquid used to treat the composition to form the light transmitting pattern is an agent which bleaches the dye of the composition and optionally simultaneously dissolves the composition. For example, the bleaching agent may be a diazotype corrector based on stannous chloride. In an example of this embodiment illustrating the use of another bleaching agent there may be used a sheet of dimensionally stable polyethylene terephthalate, such as that known under the Trade Mark "MELINEX", which is coated with a layer of a composition comprising gelatin having a yellow dye (C.I. 19540) dispersed therein. This colour was chosen since when the sheet was placed over an assembly of positives the edges of these positives could be readily seen yet, when interposed between a positive working presensitised lithographic plate, comprising a support carrying a normal non-colour photo-sensitive layer, and a source of actinic light appropriate to that layer, the colour absorbed the actinic light and protected the layer therefrom. The yellow dye could be readily removed from the sheet by the application of an aqueous chemical bleaching solution such as sodium hypochlorite solution. The mask was produced by placing the coated Melinex sheet over the assembly of positives and then carefully painting the bleaching solution on to all parts of the coating in registry with the edges of each positive and on to parts in registry with any other matter, e.g. lines or dots, on the positives which was not to be recorded on the plate during image-wise exposure of the photo-sensitive material of the plate to the assembly of positives. As a result, a colourless zone was produced wherever the bleaching solution had been applied and hence a mask was obtained which comprised a pattern of light transmitting material which corresponded in configuration to the configuration of the positive film edges and said other matter. After rinsing in clean water and drying the completed drop-out mask was obtained.

In another method of carrying out the present invention, the liquid used to treat the composition to form the light-transmitting pattern comprises an agent which dissolves the composition. In an example, there may be used a Melinex film coated with a composition comprising a dye, preferably yellow, in an organic binder and selected parts of the composition may be removed by applying a liquid comprising a suitable solvent for the binder. In the case where the composition includes an alkali soluble binder, the liquid is an alkaline solution. Examples of suitable alkali soluble binders are polymers containing free carboxylic acid groups such as cellulose acetate hydrogen phthalate (Eastman Kodak Organic Chemicals List No. 4642); Laropal S, a colophony containing resin having an acid number of 210 to 240 of Badische Anilin and Soda Fabrik; styrene maleic anhydride copolymer such as Lytron 810 or 820 of Monsanto Chemicals Ltd.; alkyd resins such as Phthalopal PP and Phtalopal SEB of Badische Anilin Soda Fabrik; and polyvinyl hydrogen phthalate (Eastman Kodak Organic Chemicals List No. 5527). In the case where the composition includes an acid soluble binder, such as an aniline formaldehyde resin, the liquid is an acidic solution.

In each case, in use of the resultant mask the layer of photo-sensitive material on the lithographic plate is image-wise exposed to the assembly of positives. As a result, the photo-sensitive material of the plate is solubilised in all areas where it has been struck by actinic light. These areas exclude areas corresponding to the positive film edges made by the shadows cast by these edges. Moreover, these areas may exclude areas corresponding to said other matter which it is not desired to become recorded on the plate. Thereafter the mask is arranged in registry with the plate and the plate is subjected to an additional exposure through the mask. As a result, actinic light strikes those areas of the plate corresponding to the colourless zones in the mask but does not strike those areas protected by the non-light transmitting composition of the mask. Thus, those areas of the photo-sensitive material corresponding to the positive film edges and to the other unwanted matter are struck by light and hence are solubilised. After suitable development, all the solubilised areas are removed with the result that only the desired image remains on the support of the plate.

It will be apparent that the mask can be produced in a simple manner even though the pattern to be applied thereto may be quite complex since, in effect, the pattern can be merely traced out in the treating liquid when the coated film is superposed on the assembly of positives. Moreover, if any errors were to occur when producing the pattern on the mask i.e. by applying the treating liquid in the wrong place, these errors can be readily corrected by covering up the unwanted colourless zone thereby produced by means of for example light absorbing tape or even by applying an overlay of more of the non-light transmitting composition. When similar errors occur on an exposed and developed printing plate when the stop-out or staging solution is applied in the wrong place, the plate is generally ruined. In addition, the mask can be used more than once if duplicate or replacement images of the printing plate or design are required and hence the manual work involved in producing the pattern on the coated sheet does not have to be repeated. Moreover, by carrying out exposures in accordance with the present invention, it is possible to achieve fully automatic processing which has hitherto been impractical.

Although it has been stated in the foregoing that the image-wise exposure is given prior to the exposure through the mask there is no reason why these exposures should not be reversed in order.

Also, although the foregoing description refers to presensitised positive working surface plates, the present invention can be carried out in conjunction with the traditional reversal deep-etch methods of plate making or with any other type of photo-sensitive material or system.

The following Examples illustrate the invention. In each case, the mask was produced using a sheet of polyethylene terephthalate which had been suitably treated in known manner to ensure dimensional stability and adhesion of the non-light transmitting compositions.

EXAMPLE 1

A grained aluminium positive-working quinone diazide presensitised lithographic printing plate (a Positive Sensalith plate of Howson-Algraphy Limited) was image-wise exposed beneath an assembly of translucent films carrying line and half-tone positive images. The assembly of films was held together by adhesive tape. All areas of the plate which were struck by actinic light were rendered soluble in alkali. As a result of shadows cast by the film edges and by the adhesive tape, some areas of the plate which should have been struck by light were not in fact adequately struck by light and would not have become soluble in alkali.

A yellow translucent film such as might be used as a photographic light filter and comprising a subbed sheet of polyethylene terephthalate (Melinex) of thickness 0.004 inch coated with a non-actinic-light transmitting composition comprising Phtalopal PP as binder and Titan Yellow dye (C.I. No. 19540) was used. The degree of colouration of this film was such that it substantially or completely removed the actinic light to which the plate was sensitive and this coincided with an optical density of 0.9 when measured on a Kodak Colour Densitometer through its blue filter. The yellow film was placed over the assembly of films. The assembly of films and particularly the film edges and the adhesive tape could be seen through the yellow film. A deletion fluid comprising equal volumes of ethanolamine and N-methyl pyrrolidine was then "painted" by means of a small artist's brush on to the coating on the sheet in registry with the edges of the assembled films and the adhesive tape. The painted areas of the coating turned red and became solubilised. These solubilised areas were then removed by wiping with a swab wet with a mixture of 275 ml of water, 25 ml of phosphoric acid (S.G. 1.75) and 200 ml of isopropanol. There was thus obtained a mask provided with a light-transmitting pattern conforming to the painted areas.

The previously exposed plate was then given a second exposure through the prepared yellow mask. Owing to the absence of a strong colour change in the exposed areas of the plate, the mask could not be registered visually, but was accurately registered by means of two holes punched along one edge, which corresponded to two similar holes punched in the plate, all of which were located on two steel pins. The exposure was for 2½ minutes to the same light source as that used for the first exposure.

In this manner, those areas of the plate which should have been struck by light during the image-wise exposure, but which were shielded by the edges of the films and by the translucent adhesive tape, were struck by the light passing through the light transmitting areas of the mask.

The plate was then processed in accordance with the manufacturer's instructions using the alkaline "Positive Developer" and the "Positive Fixer" desensitiser of Howson-Algraphy Limited. On development it was found that all of the light struck areas of the coating had been removed from the grained aluminium background, and after desensitising, a satisfactory lithographic printing plate was obtained. No local treatment of the plate was required before clean, well defined copies were obtained when it was mounted on an offset printing machine.

Prior to this invention similar plates had been made without the benefit of the masking film. This was effected using the "Positive Deletion Fluid" of Howson-Algraphy Limited in accordance with their instructions to remove the film edge marks from the plate itself. This gave rise to trouble due to the difficulty of accurately controlling the deletion fluid which tended to spread and deleteriously affect the printing image.

EXAMPLE 2

The following illustrates a preferred manner in which this invention can be practised.

A sheet of translucent polyester film, 0.004 inch thick, as obtained from Imperial Chemical Industries Limited, was coated with a non-light transmitting composition by applying thereto a solution comprising a colourless alkyd resin called Phtalopal PP obtained from Allied Colloids Ltd., and an orange dye, Oil Orange 'E' dyestuff (Colour Index No. 12055) obtained from Williams (Hounslow) Ltd. Phtalopal PP is an alcohol and alkali soluble unmodified pentaerythritol alkyd resin having an acid value of 180 to 200 and a softening point of 90° to 105°C. The resin is obtainable from Allied Colloids Ltd. of Bradford. The amount of dye present was such that a final dry film weight of 8 $g/m^2$, when measured through the green filter of a Kodak Colour Densitometer, recorded a density of 0.7. This orange coloured dye was chosen because, in addition to sufficiently absorbing the ultra violet and visible actinic light to which positive-working light sensitive printing plates are sensitive, it also contrasted with the blue coloured image produced on exposure of the plate with which it was subsequently to be used viz. the quinone diazide sensitised Olympic plate of Howson-Algraphy Limited. The superimposition of the orange layer on the blue produced a black coloured pattern which could be readily seen.

The orange foil was placed face uppermost over a complicated assembly of line and half-tone film positives, and the regions which were not required to appear on the final printing plate were carefully painted over with the following aqueous solution. Particular attention was directed to the edges of the individual positives.

| | |
|---|---|
| Water | 100 mls |
| Polyacrylamide | 15 grams |
| Sodium Carbonate Anhydrous | 10 grams. |

This solution dissolved the resin of the composition in those parts where it was applied. After two minutes, the treated foil was removed, rinsed with water and rubbed lightly whereupon the composition in the treated areas was completely removed to reveal the underlying translucent polyester film. The mask could be dried quite rapidly. The mask was then employed in conjunction with the assembled positives to produce several identical plates. These were prepared by taking unexposed Olympic plates from their wrappers, and exposing each in turn for a suitable time to the positive assembly and the mask respectively, prior to processing in accordance with the manufacturer's instructions.

EXAMPLE 3

Although the plates produced in the previous Example were satisfactory, a few weeks later a further much larger edition of 800,000 copies were required.

By using the same assembly of films, and the same orange coloured mask, multi-metal plates were prepared without recourse to any further hard work. The plate used consisted of chromium surfaced copper, laminated to aluminium. The plates were coated with a dichromate sensitised poly(vinyl alcohol) solution ("A65" as supplied by Howson-Algraphy Limited) and formed into printing plates using a conventional photolithographic process. In this process, development was carried out with water and the copper image was produced by etching the chromium with a hydrochloric acid containing etching solution known as "P.V.A. Chromium Etch" (Howson-Algraphy Limited). The remaining unwanted light hardened poly(vinyl alcohol) was removed in accordance with co-pending U.S. Application No. 220,459 (filed Jan. 24, 1972), now U.S. Pat. No. 3,796,603 dated Dec. 11, 1973 and the plate successfully completed by applying an aqueous solution of gum arabic in the normal manner.

This Example demonstrates a particular value of our invention, in that the intricate array of film edges does not have to be re-painted when each new printing plate is required even if it employs a different light sensitive system in its preparation.

EXAMPLE 4

This Example illustrates the use of a red coloured non-light transmitting composition. A sheet of glass was coated with a composition comprising Oil Red TAX dyestuff obtained from Williams (Hounslow) Ltd. under the number 153038, Oil Orange E as used in Example 2 and Phtalopal SEB to form a deep red coloured layer on the glass. The amount of dye used was similar to that of Example 2. Phtalopal SEB is an unmodified alkyd resin having a softening point of about 70° to 80°C and an acid value of 80 to 90. The resin becomes water soluble in the presence of alkali and is obtainable from Allied Colloids Ltd. of Bradford.

When the layer was thoroughly dry it was found that the required colourless areas could be created without difficulty while the coated glass sheet was in position over an assembly of positives. They could be obtained by mechanical means (e.g. by locally scribing or scraping the layer from the glass sheet). This technique is, however, tedious and time consuming. Thus the colourless areas were produced in accordance with the present invention, by locally applying a suitable non-aqueous solution to solubilise the layer in the desired areas, rinsing with water and rubbing lightly. The non-aqueous solution in this instance consisted of:

| | |
|---|---|
| Casein | 60 grams |
| Xylene | 100 mls |
| Ethanolamine | 150 mls |
| N-methyl-2-Pyrrolidine | 250 mls. |

A mask prepared in this manner was used in conjunction with several photographic line positives to produce a satisfactory printing plate. The plate employed was of the type designated "P4" by its supplier, Kalle A.G. and believed to comprise a quinone diazide and the appropriate "Ozasol" developer and fixer were used in accordance with the supplier's instructions.

We claim:

1. A method of exposing a layer of positive-working photosensitive material which comprises assembling together a plurality of positive films to produce an image, preparing a mask by providing a sheet of actinic light transmitting material coated with a composition which does not transmit actinic light, said coated sheet being visible light transmitting, and painting parts of said composition with a liquid which interacts with said composition to permitactinic light to be transmitted through said sheet and thereby to form on the sheet an actinic light transmitting pattern corresponding to the pattern defined by the edges of the films in the assembly, and exposing the layer to actinic light through said mask either before or after subjecting the layer to an image-forming exposure through the assembly.

2. A method as claimed in claim 1, wherein the composition comprises a binder and an actinic light absorbing dye.

3. A method according to claim 2, wherein said dye is a bleachable dye and said liquid is a bleaching agent capable of rendering the dye colourless.

4. A method according to claim 2, wherein said liquid is a solvent for the binder.

5. A method according to claim 2, wherein said binder is an alkali soluble resin and the said liquid is an alkaline liquid.

6. A method according to claim 1, wherein said sheet of actinic light transmitting material is formed of polyethylene terephthalate.

7. A method according to claim 1, wherein the layer of photo-sensitive material forms part of a photosensitive plate suitable for the production of a lithographic printing plate.

8. A method according to claim 1, wherein the photo-sensitive material is a quinone diazide.

* * * * *